(12) United States Patent
Muench (10) Patent No.: US 7,153,143 B2
(45) Date of Patent: Dec. 26, 2006

(54) CIRCUIT CARRIER AND PRODUCTION THEREOF

(75) Inventor: Thomas Muench, Laaber (DE)

(73) Assignee: Infineon Technologies A.G., Munich (DE)

( * ) Notice: Subject to any disclaimer, the term of this patent is extended or adjusted under 35 U.S.C. 154(b) by 0 days.

(21) Appl. No.: 11/292,082

(22) Filed: Dec. 2, 2005

(65) Prior Publication Data

US 2006/0084285 A1    Apr. 20, 2006

Related U.S. Application Data (63) Continuation of application No. 10/912,146, filed on Aug. 6, 2004, now Pat. No. 6,991,470, which is a continuation of application No. PCT/DE03/00321, filed on Feb. 5, 2003.

(30) Foreign Application Priority Data

Feb. 8, 2002    (DE) .................. 102 05 450

(51) Int. Cl.
 *H01R 12/00*    (2006.01)
(52) U.S. Cl. .................. 439/55; 174/256; 174/261
(58) Field of Classification Search .................. 439/55, 439/43, 59–60; 174/261–266, 256; 29/840
See application file for complete search history.

(56) References Cited

U.S. PATENT DOCUMENTS

| | | | | |
|---|---|---|---|---|
| 3,861,135 A | * | 1/1975 | Seeger et al. ............ 368/88 |
| 3,898,370 A | | 8/1975 | Davy et al. ............... 174/68.5 |
| 4,095,866 A | | 6/1978 | Merrill | |
| 5,045,642 A | | 9/1991 | Ohta et al. ............... 174/266 |
| 5,243,142 A | | 9/1993 | Ishikawa et al. ........... 174/262 |
| 5,371,404 A | * | 12/1994 | Juskey et al. ............. 257/659 |
| 5,464,950 A | * | 11/1995 | Horiuchi et al. ........... 174/256 |
| 5,468,918 A | * | 11/1995 | Kanno et al. ............. 174/256 |
| 5,480,309 A | | 1/1996 | Arisaka .................. 439/43 |
| 5,740,606 A | | 4/1998 | Rose .................... 29/840 |
| 5,792,375 A | | 8/1998 | Farquhar ................. 261/34 |
| 5,870,289 A | * | 2/1999 | Tokuda et al. ............. 361/779 |
| 6,024,587 A | | 2/2000 | Garth ................... 439/101 |
| 6,308,879 B1 | | 10/2001 | Burkart ................. 174/261 |
| 6,359,235 B1 | * | 3/2002 | Hayashi ................. 174/260 |
| 6,369,336 B1 | | 4/2002 | Obata ................... 174/266 |
| 6,407,343 B1 | * | 6/2002 | Tanaka .................. 174/261 |
| 6,528,735 B1 | * | 3/2003 | Bhatia et al. ............. 174/260 |
| 6,720,501 B1 | * | 4/2004 | Henson ................. 174/262 |
| 6,754,057 B1 | * | 6/2004 | Pereira et al. ............. 361/15 |
| 6,777,620 B1 | * | 8/2004 | Abe .................... 174/255 |
| 6,784,377 B1 | * | 8/2004 | Chamberlin et al. ........ 174/265 |
| 6,983,535 B1 | * | 1/2006 | Crockett et al. ........... 29/832 |

FOREIGN PATENT DOCUMENTS

| | | |
|---|---|---|
| DE | 4102435 A1 | 1/1991 |
| DE | 19543894 A1 | 11/1995 |
| EP | 0 436 943 B1 | 7/1991 |
| EP | 0 706 152 B1 | 10/1995 |

(Continued)

*Primary Examiner*—Michael C. Zarroli
(74) *Attorney, Agent, or Firm*—Edell, Shapiro & Finnan, LLC (57) ABSTRACT

A circuit carrier includes a substrate with two oppositely arranged areas. The terminal contacts of a flat connector strip are arranged in the edge regions of the areas. A through contact is arranged under at least one of the terminal contacts with concealed electrical connection to the rear side of the terminal contact and the top side of the terminal contact exhibits an undisturbed morphology and planar surface.

12 Claims, 8 Drawing Sheets

FOREIGN PATENT DOCUMENTS

| | | |
|---|---|---|
| WO | WO 93/01634 A2 | 1/1993 |
| WO | WO 09/807191 A1 | 2/1998 |
| WO | WO 98/20540 A1 | 5/1998 |

\* cited by examiner

CIRCUIT CARRIER AND PRODUCTION THEREOF

CROSS REFERENCE TO RELATED APPLICATIONS

This application is a continuation of U.S. patent application Ser. No. 10/912,146, filed Aug. 6, 2004 now U.S. Pat. No. 6,991,470, entitled "Circuit Carrier and Production Thereof," which is a continuation of PCT/DE03/00321, filed Feb. 5, 2003, which claims priority under 35 U.S.C. §119 to German Application No. DE 102 05 450.9, filed on Feb. 8, 2002, the entire contents of which are hereby incorporated by reference.

FIELD OF THE INVENTION

The invention relates to a circuit carrier and a method of producing the same.

BACKGROUND

The construction of complex circuits requires circuit carriers having metal layers with conductor tracks that are patterned in mono-layer, double-sided or multi-layer fashion. The conductor tracks are in part connected to electronic devices on or in the circuit carrier by through contacts. In one edge region, circuit carriers of this type have flat connector strips that connect the circuit carrier with its electronic devices to other circuit carriers, for example, by BUS lines. Flat connector strips of this type must be free of components and electronic devices in order to be introduced into corresponding connector sockets. Moreover, the surface of the terminal contacts of a flat connector strip have to be planar and free of disturbances. Consequently, circuit carriers with flat connectors have the disadvantage that the circuit carrier area in the region of the flat connector strips cannot be used for any further functions. In the course of miniaturization, however, it is necessary to utilize the areas of the flat connector strips for further functions of the circuit carrier.

SUMMARY

A circuit carrier can include terminal contacts of a flat connector strip. The top side of the terminal contacts have an undisturbed morphology and planar surface. The circuit carrier volume in the region of the flat connector strip contributes to the miniaturization of the circuit carrier.

According to the invention, the circuit carrier has a substrate with two oppositely arranged areas. At least one edge region of the substrate has terminal contacts of a flat connector strip at least on one of its areas. In this case, the terminal contacts are arranged in a predetermined grid dimension. A through contact is arranged under at least one of the terminal contacts with concealed electrical connection to the rear side of the terminal contact. The top side of the terminal contact has an undisturbed morphology and planar surface.

The linking of the terminal contacts to the wiring of the circuit carrier is arranged within the region of the terminal contacts rather than being carried out outside the region of the terminal contacts and thus taking up area. By virtue of the conductor tracks of the circuit carrier being linked to the terminal contacts directly under the terminal contacts, the conductor tracks of a circuit carrier are relatively shortened and the overall size of the circuit carrier can be reduced.

From the through contact with a passage hole concealed by the terminal contact, it is possible not only for conductor tracks to emerge, but also for bonding wires to be connected. The uncovered rear side of a terminal contact in the region of a through contact can be utilized for further connections without disturbing the morphology of the top side of the terminal contact.

The through contact may have a metallic wall coating that touches the rear side of the terminal contact.

The diameter of the through contact can be selected so that the rear side of the terminal contacts can be uncovered over almost the whole width in order to utilize the rear side of the terminal contacts for further connections. Consequently, the through contact fulfills a multiple connection function by the wall coating and by the uncovered rear side of the terminal contacts.

Furthermore, the through contact may have a metallic filling that touches the rear side of the terminal contact. In this case, a further linking, for example, of a bonding wire, may likewise be effected on the filled region of the through contact. A through contact of this type relatively reduces the resistance of the through contact so that the through contact has an order of magnitude improvement in the contact resistance as compared to a through contact with a metallic wall coating.

The through contact may also have a filling made of electrically conductive plastic that touches the rear side of the terminal contact. Such fillings can be introduced relatively easily into the opening of the through contact without damaging the terminal contact from the rear side, and, consequently, an undisturbed morphology of the surface of the terminal contact is maintained.

Furthermore, the area of the substrate remote from the terminal contacts may have at least one conductor track connected to the through contact. The number of conductor tracks that can be connected to such a through contact can depend on the width of the conductor track and the circumference of the wall coating of the through contact. Consequently, the terminal contact, in the region of the area which it requires, may be electrically connected to a plurality of conductor tracks on the opposite area of the substrate, so that electrical nodes can be located in the region of the area of terminal contacts.

Conductor tracks arranged on the area of the substrate opposite the terminal contacts may have metals, such as copper alloys, nickel alloys, aluminum alloys, silver alloys, or gold alloys. However, conductor tracks may be made of electrically conductive plastic. These conductor tracks can be applied subsequently, i.e., the tracks do not have to be completely finished at the same time as the patterning of the conductor tracks on the substrate. Rather, with the aid of conductor tracks made of electrically conductive plastic, the customer can subsequently perform connections relatively easily and thus modify the circuit carrier.

Moreover, a bonding wire in the through contact, which is bonded directly onto the rear side of the terminal contact, can be arranged. A multiple use of the area of the terminal contact is realized by such a bonding connection, since not only are conductor tracks connected to the through contact, but the uncovered rear side of the terminal contact is also available for bonding connections in the region of the covered through contact hole.

For the conductor track made of electrically conductive plastic and for filling the through contacts with electrically conductive plastic, the plastics composition used is filled with electrically conductive micro- or nanoparticles. These filling materials have gold, silver, nickel, copper, aluminum, or alloys thereof. Using nanoparticle sizes, the filled plastics composition can be applied to the substrate in relatively fine patterned fashion than with microparticles.

UV-curing or thermally curing plastics may be used as the electrically conductive plastic. A polyamide acetic acid ester enriched with nanoparticles and dissolved in N-methyl-pyrrolidine can be a starting material for one of the electrically conductive plastics. The polyamide acetic acid ester dissolved in N-methyl-pyrrolidine may be applied to the substrate as a filling material for the through contacts or as a conductor track and is subsequently crosslinked at elevated temperature to form a solid electrically conductive plastic. However, the plastic may also be admixed beforehand with a catalyst material or an adhesion promoter in the basic plastics composition made of polyamide in order to improve the conductivity and to increase the adhesion on the substrate of the conductor tracks.

The circuit carrier may have, as the substrate, two circuit boards with semiconductor chips embedded in plastics composition in between. The semiconductor chip can be protected against mechanical stress and have an intensive cooling against thermal loading, especially as the terminal contacts include large-area heat sinks of a circuit. The two circuit boards make it possible to realize an arrangement of terminal contacts having terminal contacts that are insulated from one another on both sides of the circuit carrier. Besides the intensive utilization of the circuit carrier in the region of the terminal contacts by the fitting of semiconductor chips, the number of terminal contacts of a flat connector strip is distributed between two surfaces and the total area requirement is thus halved.

A further densification of the circuit in the flat connector region can be achieved by using multilayer printed circuit boards as the substrate. For circuit modules, the individual conductor track layers may additionally have structures for passive components, such as resistors, capacitors, and inductors.

In high frequency and extremely high frequency application, it is possible to use substrates made of multilayer ceramic boards and to utilize the volumes under the terminal contacts already for an intensive and compact wiring.

A method for producing a circuit carrier having a substrate with terminal contacts in a predetermined grid dimension, at least one through contact being arranged under one of the terminal contacts with concealed electrical connection to the rear side of the terminal contact, has the following method steps.

Firstly, an insulating substrate is provided. Passage holes are introduced into the insulating substrate in regions in which terminal contacts are provided. The walls of the passage holes may subsequently be coated with metal without terminal contacts covering the passage holes. Afterward, the terminal contacts are applied and the metalized passage holes are covered in the process. For this purpose, a metal foil that is dimensionally stable and self-supporting on the passage holes may be fixed on the substrate and subsequently patterned. The application of the self-supporting metal foil with a metal foil thickness of between 18 µm and 150 µm produces an electrical connection between the metal foil and the metalization of the passage holes and creates a dimensionally stable covering of the through contact with the passage hole. With the patterning of the metal foil, it is possible to pattern the terminal contacts and to prepare conductor tracks for populating the substrate with semiconductor devices.

The area of the terminal contacts for a through-plating and an electrical connection of the terminal contacts to electronic devices can be realized on the rear side of the circuit carrier. For this purpose, metal foils are also applied on the rear side as on the top side, and can be patterned to form conductor tracks. In the region of the terminal contacts, the conductor tracks may then be connected to the through contact. By the conductor tracks, semiconductor chips can be directly connected to the through contacts in the region of the terminal contacts using flip-chip technology. If the semiconductor chip is provided for a bonding technology, then it is possible to fix the bonding wires on the contact areas of the semiconductor chip and route them directly to the rear side of the terminal contact through the through contact.

Alternatively, through contacts can be located in the region of terminal contacts by not producing the passage holes before application of the metallization. Rather, the passage holes are created with the aid of laser removal after the application of the metalization through the substrate. The removal stops at the interface with the terminal contacts and, consequently, the morphology of the top side of the terminal contact is undisturbed.

After passage holes have been introduced into an insulating substrate, the substrate is coated on both sides with a non-self-supporting metal foil having a thickness of less than or equal to 18 µm. Afterward, the metal foil is patterned by a photoresist patterning such that the passage holes remain covered by the metal foil on one side, mainly on the substrate side that is provided for terminal contacts. Afterward, the resulting metal structures are reinforced galvanically on both substrate sides and a metal coating is deposited on the passage holes. A relatively higher degree of fine patterning can be achieved since the foil thickness is extremely small.

The positioning of one or more covered cavity structures, also called "tented via" or "tented blind via," in the region of the metalization of the terminal contacts of a flat connector strip, i.e., "edge connector pads," in the case of electronic assemblies, includes at least one integrated circuit and possibly specific passive additional elements, such as resistors, capacitors, or inductors, and enables the flat assembly designer to achieve a relatively more efficient with regard to requirements with high wiring density, i.e., "high density interconnect wiring" and/or with limited space ("limited real estate") in the arrangement or the "placement" and the connection technique, such as a "surface mount technology" of the placement elements, i.e., the "components".

This positioning, according to the invention, of covered cavity structures beneath the terminal contacts has not been utilized hitherto in the case of connector strips and other applications. Rather, this connection is realized outside the terminal contacts by metalized openings, i.e., the "plated vias," which may be covered with soldering resist or with solder. A high space requirement is required and, consequently, does not permit further miniaturization of the circuit carriers. However, the geometry of the terminal contacts is not disturbed by openings, such as the "vias," by solder points, or by soldering resist points. Each opening in the region of the terminal contacts would visibly infringe the surface and morphology of the terminal contact and, in the case of sliding contacts, cause an infringement of the initially homogeneous metal area of the plug contact.

Consequently, the present invention yields a design of a 100% conductively covered through-contact opening with undisturbed morphology beneath the area of the plug contacts on the outer layers combined with a homogeneous contact area without mechanical incorrect contact-connection with the possibility of realizing, under the terminal contact, a buried linking of conductor tracks on inner layers of multilayer printed circuit boards or by linking the rear side of the terminal contact with the aid of a through contact and further-reaching contact-connection methods, such as soldering, adhesive bonding and bonding, particularly, in the case of two-layer circuit carriers. The invention can be used in many assemblies and products, for example, a multimedia card, which have hitherto been commercially available in an embodiment with flat plug contacts due to housing or design dictates, and it is thus possible to achieve a considerable degree of minimization for these products.

BRIEF DESCRIPTION OF THE FIGURES

The invention will now be discussed in more detail on the basis of embodiments with reference to the accompanying figures.

DETAILED DESCRIPTION

Figure 1:
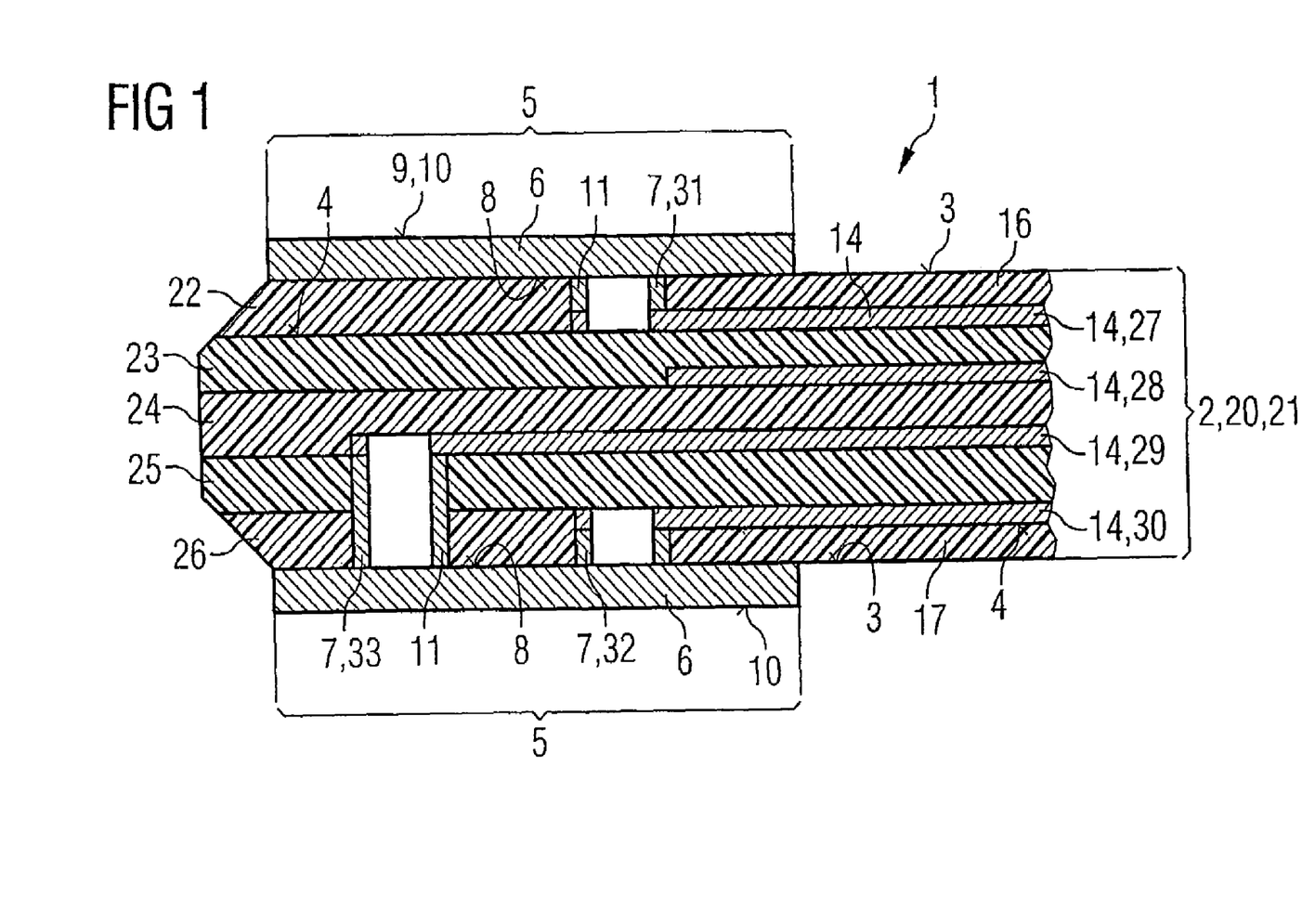
FIG. 1 shows a diagrammatic cross section through a circuit carrier in accordance with a first embodiment of the invention.

FIG. 1 shows a diagrammatic cross section through a circuit carrier 1 in accordance with a first embodiment of the invention. The reference symbol 2 denotes a substrate, which, in this embodiment of the invention, may be either a multilayer printed circuit board 20 or a multilayer ceramic board 21. The reference symbols 3 and 4 denote mutually opposite areas of the substrate or mutually opposite areas of the individual printed circuit board layer or ceramic board layer. The reference symbol 5 denotes the edge region of the circuit carrier 1, which has terminal contacts 6 of a flat connector.

A flat connector of this type is arranged in a comb structure (FIG. 1 shows only the cross section of a terminal contact 6 on the top side of the circuit carrier 1 and of a terminal contact 6 on the rear side of the circuit carrier 1 in cross section.) The multilayer circuit carrier 1 of this first embodiment of the invention has five insulation layers 22, 23, 24, 25, 26, between which four conductor track layers 27, 28, 29, 30 are arranged. Through contacts 31, 32, 33 are arranged under the area of the terminal contacts 6 without disturbing the morphology and the planarity of the surfaces of the terminal contacts 6. The through contacts 31, 32, 33 electrically connect the terminal contacts 6 to the various conductor track layers 27, 28, 29, 30. In this embodiment, the terminal contact 6 on the top side of the circuit carrier 1 is connected to conductor tracks in the conductor track layer 27 by the through contact 31, and the terminal contact 6 on the underside of the circuit carrier 1 being connected to the conductor track layer 29 by the through contact 33 and to the conductor track layer 30 by the through contact 32.

Consequently, the area of the circuit carrier 1 under the terminal contacts 6 and between the terminal contacts 6 is utilized in order thereby to shorten the conductor track between the electrodes of semiconductor components on the circuit carrier 1 and the terminal contacts 6. In this case, the planarity and the morphology of the terminal contacts 6, in particular, of their surfaces 10, is not disturbed, so that outstanding sliding contact-making of the flat connector strip continues to be ensured. In this embodiment of the invention in accordance with FIG. 1, the through contacts 31, 32, 33 constitute covered cavities, the walls 7 of the cavities being metalized and producing the electrical connection between terminal contacts 6 and conductor track layers 27, 28, 29, 30.

Figure 2:
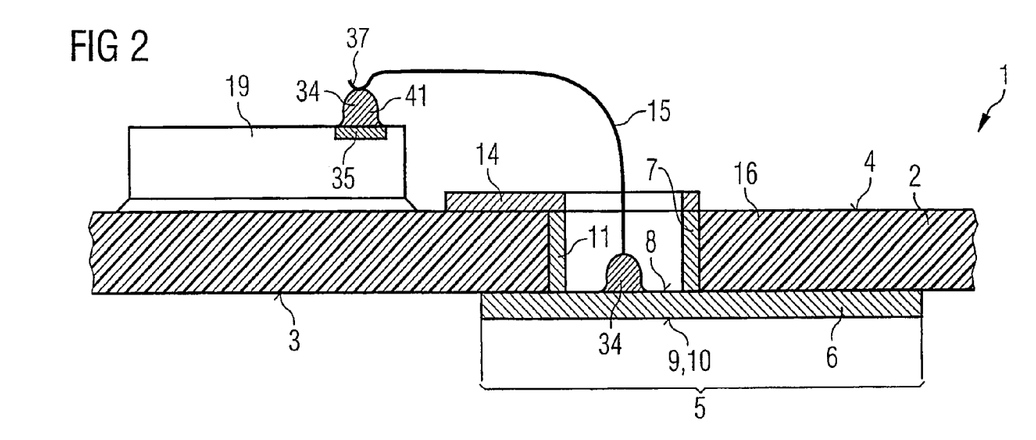
FIG. 2 shows a diagrammatic cross section through a circuit carrier in accordance with a second embodiment of the invention.

FIG. 2 shows a diagrammatic cross section through a circuit carrier 1 in accordance with a second embodiment of the invention. Components with functions identical to those in FIG. 1 are identified by identical reference symbols and are not discussed separately.

In this second embodiment of the invention, the through contact 7 under the terminal contact 6 is used as in the embodiment according to FIG. 1. In addition, a bonding wire that is electrically connected to the rear side of the terminal contact 6 is led through the through contact 7. This electrical connection may be realized by a compression technique. A compression head 34 is connected to the rear side of the terminal contact 6. The bonding wire is led from the rear side of the terminal contact 6 through the through contact 7 to a contact area 35 of a semiconductor chip 19. A bonding arc 37 may be formed from the bonding wire 15 on a prepared compression head 41 on the semiconductor chip 19. For bonding, the contact area may be refined with a bondable metal alloy 42.

In addition to the bonding connection 15, the through contact is provided with an electrical connection to conductor tracks 14 arranged on the substrate area 4, which is opposite to the substrate area 3 on which the terminal contact 6 is arranged. The second embodiment of the invention can allow relatively diverse use of the rear side of the terminal contacts 6 for wiring on a circuit carrier 1.

Figure 3:
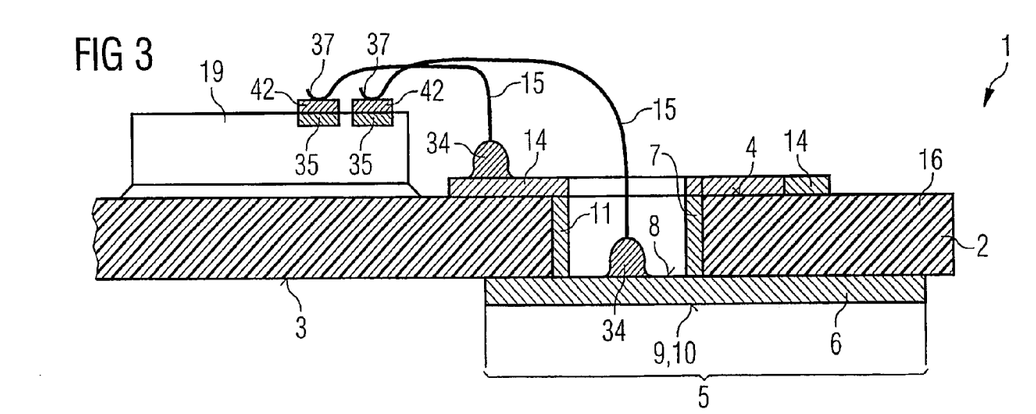
FIG. 3 shows a diagrammatic cross section through a circuit carrier in accordance with a third embodiment of the invention.

FIG. 3 shows a diagrammatic cross section through a circuit carrier 1 in accordance with a third embodiment of the invention. Components with functions identical to those in the previous figures are identified by identical reference symbols and are not discussed separately.

The difference between this third embodiment of the invention and the previous two embodiments of the invention is a triple utilization of the area and volume beneath a terminal contact 6. Also, for carrying out bonding wire connections, the bonding wire is realized on the contact areas 35 of the semiconductor chip 19 by a contact arc 37, rather than by a thermocompression head 35, as shown in FIG. 2. The underside or rear side of the terminal contact 6 is relatively equally utilized triply in the region of the through contact 7; firstly, by a bonding connection 15 to a contact area 35 of a semiconductor chip 19, furthermore by the metallic wall 11 of the through contact 7, which produces an electrical connection between the rear side 8 of the terminal contact 6 and conductor tracks 14 on the substrate, and finally by a line 14 which is led to the wall 11 of the through contact and, for its part, is in turn connected by a bonding connection 15 to the contact areas 35 of the semiconductor chip.

Figure 4:
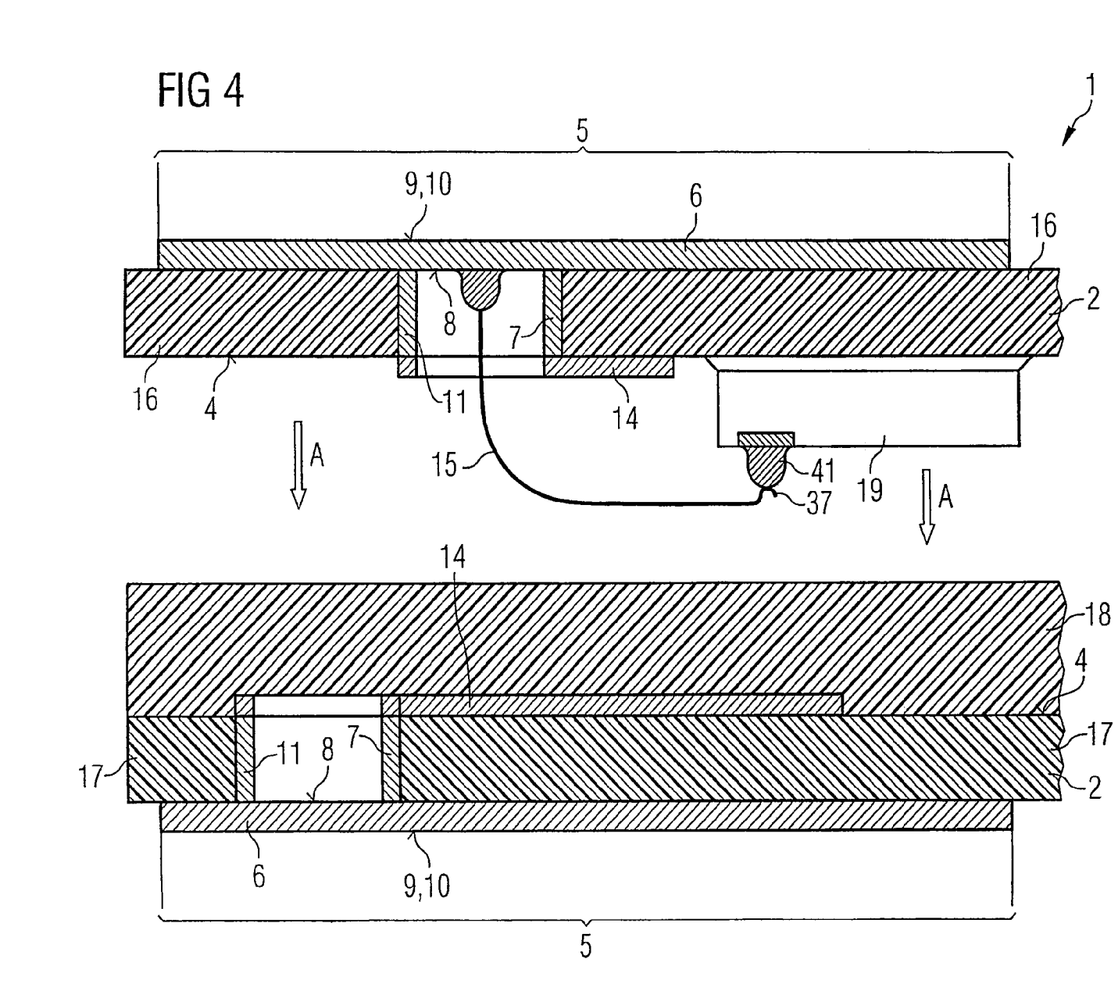
FIG. 4 shows a diagrammatic cross section through a circuit carrier of a fourth embodiment of the invention comprising two components before the latter are assembled.

FIG. 4 shows a diagrammatic cross section through a circuit carrier 1 in accordance with a fourth embodiment of the invention comprising two components before it is assembled. Components with functions identical to those in the previous figures are identified by identical reference symbols and are not discussed separately.

In this embodiment of the invention, the first and upper component of the circuit carrier 1 corresponds to the second embodiment of the invention disclosed in FIG. 2. The second component, illustrated below the first in FIG. 4, has a printed circuit board carrying a terminal contact 6, which is connected to a conductor track 14 on a substrate 2 by a through contact 7. The conductor track 14 and the through contact 7 are covered by a plastics composition 18 that can be heated and melted. In the molten state of the plastics composition 18 on the second component, the first component, corresponding to FIG. 2, is lowered with its semiconductor chip 19 and the bonding wire 15 in the direction of the arrow A onto the molten plastics composition 18, so that the semiconductor chip 19 with the bonding connection 15 is embedded by the plastics composition 18.

Figure 5:
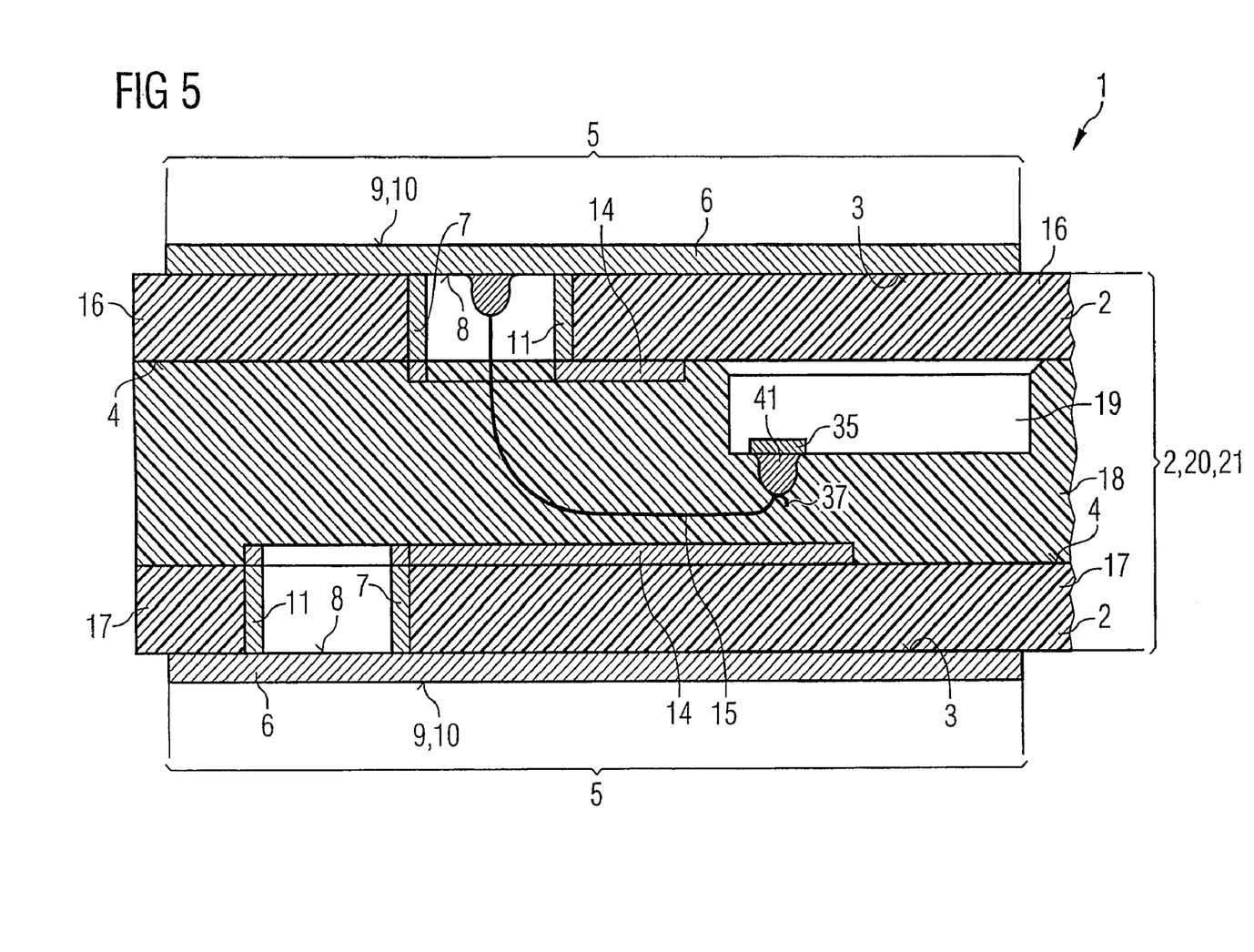
FIG. 5 shows a diagrammatic cross section through a circuit carrier in accordance with the fourth embodiment of the invention after the two components have been assembled.

FIG. 5 shows a diagrammatic cross section through a circuit carrier 1 in accordance with the fourth embodiment of the invention after the two components of FIG. 4 have been assembled. Components with functions identical to those in the previous figures are identified by identical reference symbols and are not discussed separately.

The plastics composition 18 has cooled in this illustration and forms an insulating intermediate layer between the conductor track 14 of the lower circuit board 17 and the bonding connection 15 that is arranged on the circuit board 16 and connects the semiconductor chip 19 to the rear side 8 of the terminal contact 6. FIG. 5 shows that not only conductor tracks, bonding wires and through contacts can be arranged and accommodated under the terminal contact 6, but also semiconductor chips 19 can be arranged between the terminal contacts 6. This further improves the circuit density of the circuit carrier and at the same time advances the miniaturization of the circuit carriers 1. The circuit boards 16, 17 may also be embodied in foil form and the circuit carrier 1 in accordance with the fourth embodiment of the invention may be a chip card in which, between two foils, semiconductor chips 19 are arranged in a plastics composition and their contact areas 35 are electrically connected to the terminal contacts on the top side of the through contacts and/or bonding wires.

Figure 6:
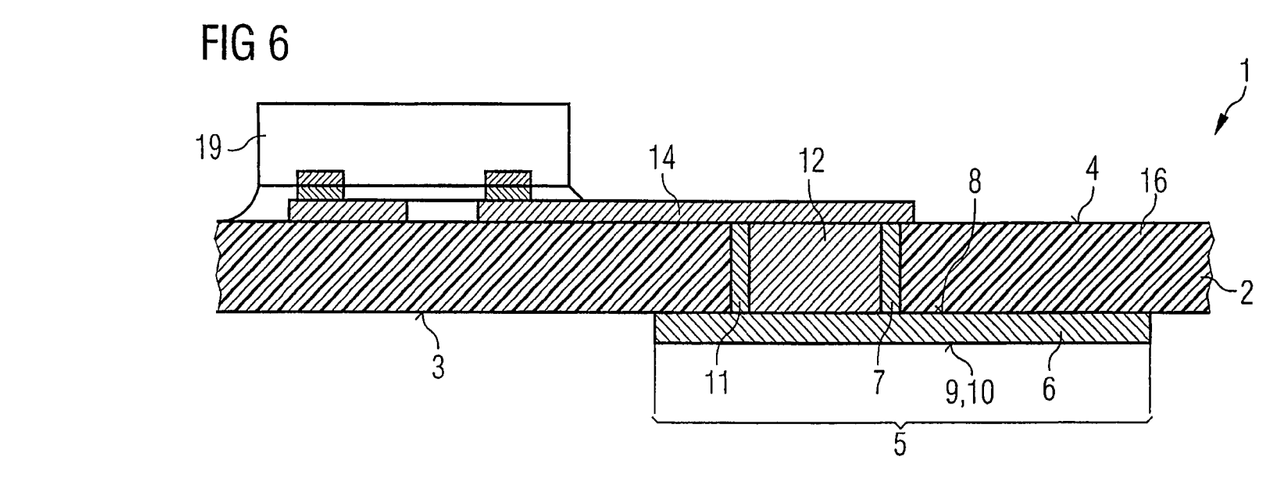
FIG. 6 shows a diagrammatic cross section through a circuit carrier in accordance with a fifth embodiment of the invention.

FIG. 6 shows a diagrammatic cross section through a circuit carrier 1 in accordance with a fifth embodiment of the invention. Components with functions identical to those in the previous figures are identified by identical reference symbols and are not discussed separately.

One difference between the fifth embodiment and the previous embodiments 1 to 4 is that a chip 19 is arranged on the conductor tracks 14 using flip-chip technology and is connected to the rear side 8 of the terminal contacts 6 by a filled through contact 7. The filled through contact 7 has an electrodeposited metallic filling 12, which, however, may also be introduced by means of a sintering method with the aid of a metal paste. With the aid of the metallic filling 12, the contact resistance of the through contact 7 is significantly reduced and, at the same time, the device height is significantly reduced in this embodiment of the invention with a semiconductor chip using flip-chip technology. If, by way of example, the fifth embodiment of the invention realizes an embedding of the semiconductor chip 19 in a plastics composition, as is shown in exemplary embodiment 4, then the thickness of the plastics composition can be significantly reduced, in principle to the thickness of the semiconductor chip 19, since no bonding wire connections have to be provided.

Figure 7:
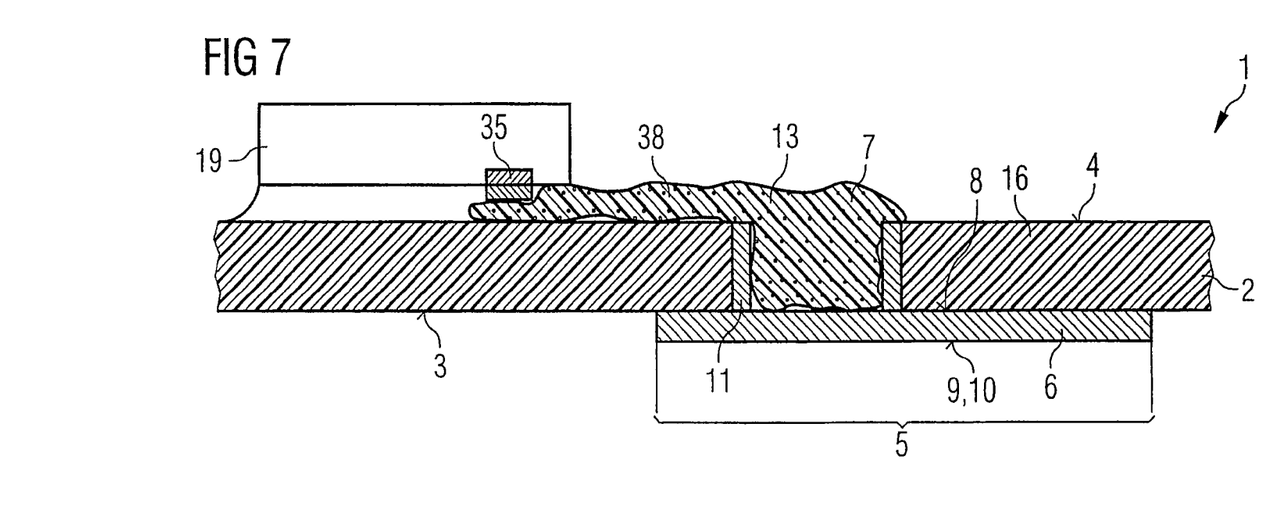
FIG. 7 shows a diagrammatic cross section through a circuit carrier in accordance with a sixth embodiment of the invention.

FIG. 7 shows a diagrammatic cross section through a circuit carrier 1 in accordance with a sixth embodiment of the invention. Components with functions identical to those in the previous figures are identified by identical reference symbols and are not discussed separately.

The difference from the previous embodiments is that the through contact 7 is filled with a conductive plastics composition. This electrically conductive plastics composition 13 may also be provided subsequently, i.e., after the positioning and placement of the semiconductor chip 19 on the substrate area 4. Such conductive plastics compositions increase the flexibility of the construction since these metallically conductive plastics can also be effected even after the substrate 2 has been populated with corresponding semiconductor chips 19. In this embodiment of the invention, too, the basic principle of the present invention is realized by arranging the through contact 7 with its electrically conductive plastic filling 13 on the rear side 8 of the terminal contact 6 and thus utilizing the rear side 8 of the terminal contact 6 for a wiring.

Figure 8:
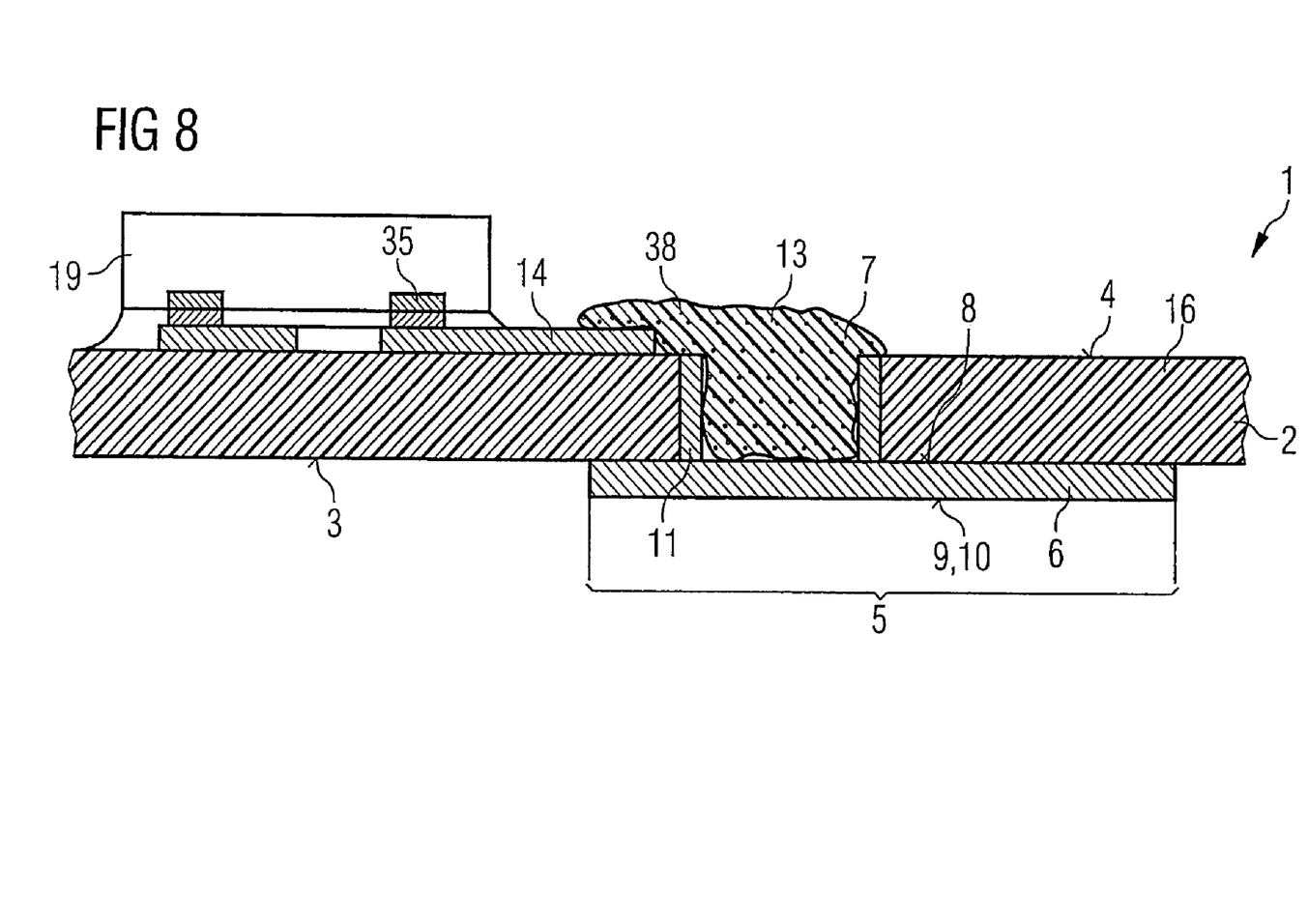
FIG. 8 shows a diagrammatic cross section through a circuit carrier in accordance with a seventh embodiment of the invention.

FIG. 8 shows a diagrammatic cross section through a circuit carrier 1 in accordance with a seventh embodiment of the invention. Components with functions identical to those in the previous figures are identified by identical reference symbols and are not discussed separately.

The seventh embodiment of the invention includes a combination of prepared electrical conductor tracks on the substrate 2 and plastic conductor tracks 14 that are introduced subsequently. For this purpose, a through contact 7 is arranged on the substrate 2 under the terminal contact 6. The through contact is connected to a metallic conductor track 14, which is previously arranged on the substrate, by a subsequently applied conductor track 38 made of electrically conductive plastic. This embodiment of the invention increases the variability of the design of circuit carriers 1 since circuit changes and circuit adaptations can still be performed relatively late in this case.

Figure 9:
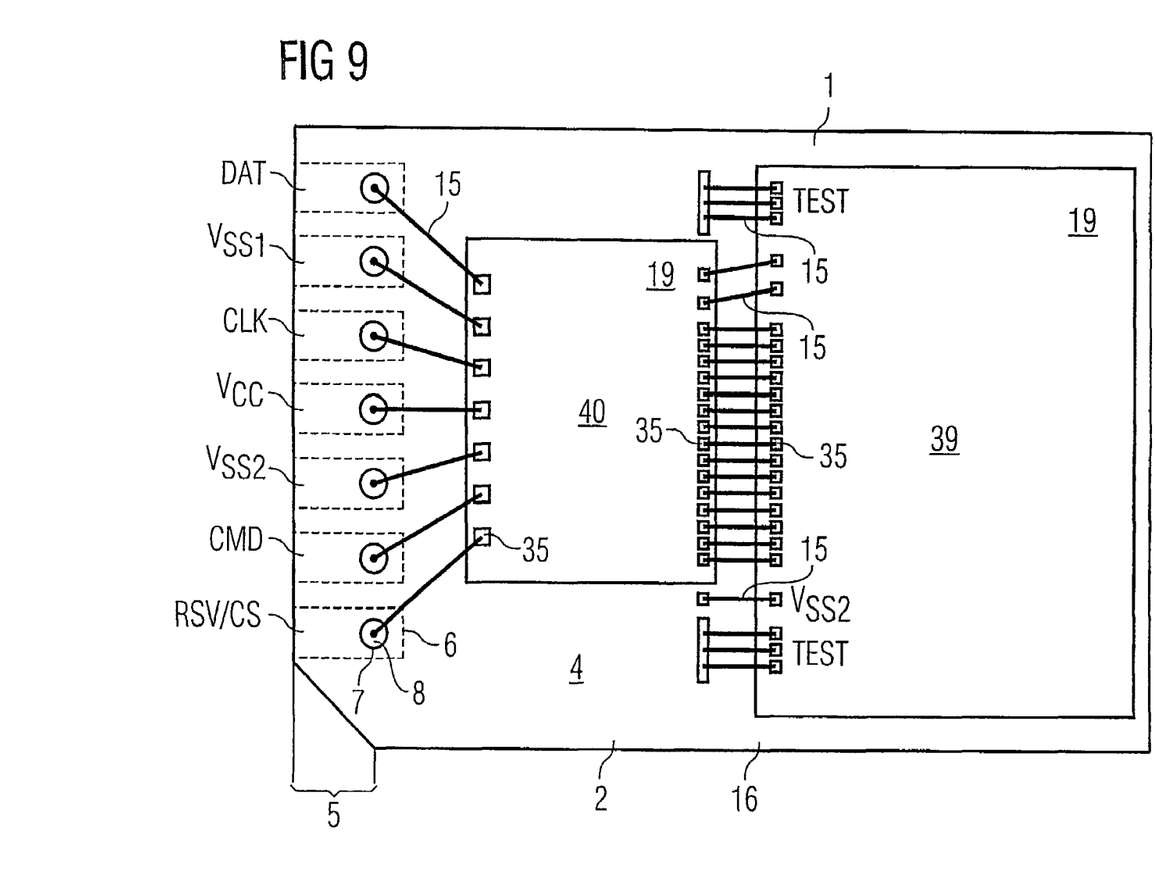
FIG. 9 shows a plan view of a placement side of a circuit carrier.

FIG. 9 shows a plan view of a placement side of a circuit carrier 1. Components with functions identical to those in the previous figures are identified by identical reference symbols and are not discussed separately.

A memory chip 39 and a logic chip 40 are arranged on the placement side on the circuit carrier 1, and are connected by bonding wires 15 from chip to chip, a contact area 35 of one semiconductor chip in each case being connected to a corresponding contact area 35 of the other semiconductor chip. The logic circuit 40 is in turn connected to a series of terminal contacts (identified by dashed lines) on the rear side of the memory module. For this purpose, corresponding contact areas 35 of the logic chip 40 are electrically connected to through contacts 7 of the terminal contacts 6 by bonding wires 15. The terminal contacts 6 are supplied with data signals, DAT, with different ground potentials $V_{ss1}$ and $V_{ss2}$ and also a supply voltage $V_{cc}$ and with clock signals CLK. By a further terminal contact 6, command signals CMD are applied to the logic chip 40 by means of a through contact 7 and a bonding wire 15. A seventh terminal contact is provided for reserve terminals RSV, such as a chip select terminal CS. In addition to the bonding connections 15 from semiconductor chip to semiconductor chip and the bonding connections 15 between semiconductor chip and through contacts and thus between semiconductor chip and terminal contacts 6, bonding connections 15 that are routed, for example, for test purposes from the memory chip 39 to the surface 4 of the substrate 2 are also arranged on the circuit carrier.

Figure 10:
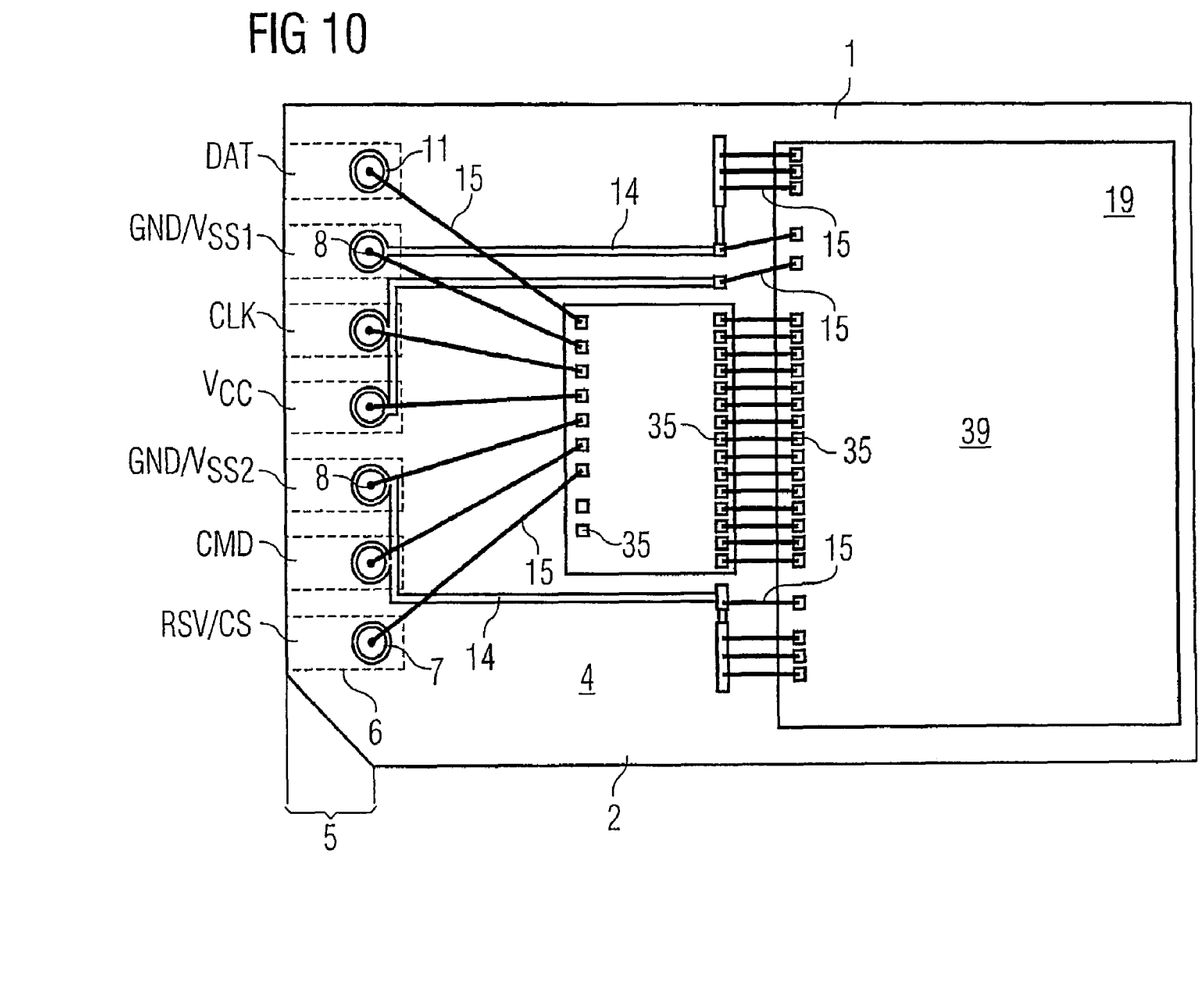
FIG. 10 shows a plan view of a placement side of a circuit carrier of a further embodiment of the invention.

FIG. 10 shows a plan view of a placement side of a circuit carrier 1 of a further embodiment of the invention. Components with functions identical to those in the previous figures are identified by identical reference symbols and are not discussed separately.

The embodiment of the invention in accordance with FIG. 10 exhibits besides bonding wires, as connection aid, also conductor tracks arranged directly on the substrate 2. These conductor tracks 14 connect the different ground potentials $V_{ss1}$ and $V_{ss2}$ to the memory chip 39, for example. FIG. 10 thus shows the high flexibility that can be achieved by using through contacts in the region of the terminal contacts 6. The terminal contacts 6 are arranged on the area of the substrate 2 opposite to the placement side and are therefore identified by dashed lines. In the region of the terminal contacts 6, the through contacts 7 are connected to conductor tracks 14 on the substrate 2 and to bonding wires 15, so that the through contacts 7, according to the invention, to the terminal contacts 6 of a circuit carrier board 1 significantly improve the possibilities of the circuit layouter.

The above description of the exemplary embodiments in line with the present invention serves merely for illustrative purposes and not to limit the invention. The invention allows various changes and modifications without departing from the scope of the invention and its equivalents.

What is claimed is:

1. A circuit carrier, comprising:
   a substrate with two oppositely arranged areas, an edge region of at least one of the areas having terminal contacts of a flat connector strip arranged in a comb structure extending along the edge region, the terminal contacts comprising flat, plug contacts suitable for engaging corresponding connector sockets via a sliding contact; and
   at least one through contact arranged under one of the terminal contacts with a concealed electrical connection to the rear side of the terminal contact, a top side of the terminal contact having an undisturbed morphology and planar surface.

2. The circuit carrier as claimed in claim 1, wherein the through contact has a metallic wall coating that touches the rear side of the terminal contact.

3. The circuit carrier as claimed in claim 1, wherein the through contact has a metallic filling that touches the rear side of the terminal contact.

4. The circuit carrier as claimed in claim 1, wherein the area of the substrate remote from the terminal contacts has at least one conductor track connected to the through contact.

5. The circuit carrier as claimed in claim 4, wherein the conductor track has an electrically conductive plastic.

6. The circuit carrier as claimed in claim 5, wherein the electrically conductive plastic has electrically conductive micro- or nanoparticles.

7. The circuit carrier as claimed in claim 5, wherein the electrically conductive plastic has as starting material, a polyamide acetic acid ester that is enriched with nanoparticles and dissolved in N-methyl-pyrrolidine.

8. The circuit carrier as claimed in claim 5, wherein the electrically conductive plastic has catalyst materials and adhesion promoters in a basic plastics composition made of polyamide in addition to the nanoparticles.

9. The circuit carrier as claimed in claim 1, wherein the substrate has a multilayer printed circuit board.

10. The circuit carrier as claimed in claim 1, wherein the substrate has a multi-layer ceramic board.

11. The circuit carrier as claimed in claim 1, wherein the through contact has a multiple connection made of electrically conductive transitions to said one of the terminal contacts to conductor tracks on the area of the substrate opposite to the terminal contact, and/or to bonding wire terminals.

12. The circuit carrier as claimed in claim 1, wherein the terminal contacts comprise metal foil.

* * * * *